(12) United States Patent
Li et al.

(10) Patent No.: US 12,034,067 B2
(45) Date of Patent: Jul. 9, 2024

(54) GaN-HEMT DEVICE WITH SANDWICH STRUCTURE AND METHOD FOR PREPARING THE SAME

(71) Applicant: SOUTH CHINA UNIVERSITY OF TECHNOLOGY, Guangzhou (CN)

(72) Inventors: Guoqiang Li, Guangzhou (CN); Dingbo Chen, Guangzhou (CN); Zhikun Liu, Guangzhou (CN); Lijun Wan, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 386 days.

(21) Appl. No.: 17/439,820

(22) PCT Filed: May 15, 2019

(86) PCT No.: PCT/CN2019/086966
§ 371 (c)(1),
(2) Date: Sep. 16, 2021

(87) PCT Pub. No.: WO2020/191892
PCT Pub. Date: Oct. 1, 2020

(65) Prior Publication Data
US 2022/0102540 A1 Mar. 31, 2022

(30) Foreign Application Priority Data
Mar. 22, 2019 (CN) .......................... 201910223719.4

(51) Int. Cl.
*H01L 29/778* (2006.01)
*H01L 21/02* (2006.01)
(Continued)

(52) U.S. Cl.
CPC ...... *H01L 29/778* (2013.01); *H01L 21/02458* (2013.01); *H01L 21/0254* (2013.01);
(Continued)

(58) Field of Classification Search
CPC ............ H01L 29/778; H01L 21/02458; H01L 21/0254; H01L 21/0262; H01L 29/2003;
(Continued)

(56) References Cited

U.S. PATENT DOCUMENTS

2005/0051796 A1* 3/2005 Parikh .................. H01L 29/402
257/E29.127
2006/0108602 A1 5/2006 Tanimoto
(Continued)

FOREIGN PATENT DOCUMENTS

CN 107611107 1/2018
CN 108231882 6/2018

OTHER PUBLICATIONS

"International Search Report (Form PCT/ISA/210) of PCT/CN2019/086966," mailed on Oct. 28, 2019, with English translation thereof, pp. 1-4.

*Primary Examiner* — Mohammad M Choudhry
(74) *Attorney, Agent, or Firm* — JCIPRNET

(57) ABSTRACT

A GaN-HEMT device with a sandwich structure and a method for preparing the same are provided. The GaN-HEMT device includes an epitaxial layer and electrodes, wherein the epitaxial layer includes a GaN channel layer (2) and an $Al_yGa_{1-y}$ barrier layer (1), and is arranged from top to bottom; the electrodes include a gate electrode (6), a source electrode (7), a drain electrode (5) and a field plate electrode (10), wherein the field plate electrode (10) and the gate electrode (6) are respectively fabricated on an upper surface and a lower surface of the epitaxial layer, and the field plate electrode (10) extends to a region beyond the epitaxial layer and is connected with the gate electrode (6) to form the sandwich structure, and the source electrode (7) and the drain electrode (5) are respectively located at two ends of the epitaxial layer.

9 Claims, 3 Drawing Sheets

(51) Int. Cl.
  *H01L 29/20*      (2006.01)
  *H01L 29/40*      (2006.01)
  *H01L 29/66*      (2006.01)
(52) U.S. Cl.
  CPC ...... *H01L 21/0262* (2013.01); *H01L 29/2003* (2013.01); *H01L 29/402* (2013.01); *H01L 29/66462* (2013.01)
(58) Field of Classification Search
  CPC ............. H01L 29/402; H01L 29/66462; H01L 29/41766; H01L 29/7781; H01L 29/42316
  See application file for complete search history.

(56) References Cited

U.S. PATENT DOCUMENTS

2010/0032717 A1   2/2010   Palacios et al.
2016/0380073 A1   12/2016  Bhalla et al.

* cited by examiner

GaN-HEMT DEVICE WITH SANDWICH STRUCTURE AND METHOD FOR PREPARING THE SAME

CROSS-REFERENCE TO RELATED APPLICATION

This is a 371 application of the International PCT application serial no. PCT/CN2019/086966, filed on May 15, 2019, which claims the priority benefits of China Application No. 201910223719.4, filed on Mar. 22, 2019. The entirety of each of the above-mentioned patent applications is hereby incorporated by reference herein and made a part of this specification.

BACKGROUND

Technical Field

The present invention relates to high electron mobility transistor (HEMT), in particular to a GaN-HEMT device with a sandwich structure and method for preparing the same.

Description of Related Art

Power electronic devices are widely used in many fields, such as household appliances, industrial equipment, automobile power supply and so on. The new generation of power electronic devices requires higher efficiency, higher power density, and higher reliability in high temperature working environment, which requires devices to have lower on resistance, higher saturation current and more optimized material system. At present, silicon-based power devices, such as MOSFET and IGBT, are widely used in power electronic devices. However, after long-term development, the performance of silicon-based electronic power devices tends to the theoretical limit of their materials, and the new generation of power electronic devices is facing great challenges such as high voltage, high frequency and small volume. GaN, the third generation semiconductor material, has the advantages of wide band gap, high migration speed of saturated electrons and stable chemical properties. Therefore, power electronic devices based on GaN materials have the advantages of small on-resistance, fast switching speed, high pressure-resistance and good high temperature resistance. GaN high electron mobility transistor is a power electronic device based on GaN material, AlGaN/GaN heterojunction is formed by epitaxy, and under the modulation of polarized electric field, two-dimensional electron gas with an area density of $10^{13}$ cm$^{-2}$ can be formed at the heterointerface even without artificial doping. Because the material is not doped, the electron mobility in GaN in two-dimensional plane exceeds 2000 cm$^2$/Vs. Therefore, GaN-HEMT has the characteristics of low on-resistance and high working frequency. It can meet the requirements of the new generation of power electronic devices for higher power, higher frequency, smaller volume and high temperature working conditions, and can be applied to AC/DC, DC/DC converters, DC/AC motor drivers and photovoltaic power generation, etc. Due to the advantages of low price, mature process and large diameter of Si substrate, the preparation of GaN-HEMT on Si substrate has become a research hotspot.

However, whether it is a single-finger gate low-current GaN-HEMT device or a multi-finger gate high-current device, most of the current processes adopt the traditional single-gate bar structure and field plate structure between the source and drain electrodes, which makes the two-dimensional electron gas limited by field effect only in a single direction, thus limiting the improvement of breakdown voltage and the further reduction of linearity of the device. To solve this problem, industry circles and some research institutions have adopted fin structure to fabricate Fin-FET structure. The gate voltage swing and linearity of GaN-HEMT devices with this structure are improved at the expense of the effective conductive channel layer width under the gate, and this method reduces breakdown voltage and power density, at the same time, nanoscale lithography increases the operational difficulty of device fabrication. Hence, it is still very necessary to develop a simple, efficient and stable method to improve the breakdown voltage and gate voltage swing of GaN-HMET and enhance the linearity and pressure-resistance property of the device.

SUMMARY

In order to overcome the shortcomings and deficiencies of the prior art and further improve the breakdown voltage and gate voltage swing of the GaN-HMET device, the present invention is intended to provide a GaN-HEMT device with a sandwich structure to achieve high linearity and high breakdown characteristics of the GaN power device.

In order to achieve the foregoing objectives, the following technical solutions are provided in the present invention.

The present invention provides a GaN-HEMT device with a sandwich structure, wherein the GaN-HEMT device includes an epitaxial layer and electrodes, wherein the epitaxial layer includes a GaN channel layer and an Al$_y$Ga$_{1-y}$N barrier layer, and is arranged from top to bottom; the electrodes include a gate electrode, a source electrode, a drain electrode and a field plate electrode, wherein the field plate electrode and gate electrode are respectively fabricated on an upper surface and a lower surface of the epitaxial layer and the field plate electrode extends to a region beyond the epitaxial layer and is connected with the gate electrode to form the sandwich structure, and the source electrode and drain electrode are respectively located at two ends of the epitaxial layer.

The present invention also provides a method for prepare the above GaN-HEMT device with the sandwich structure, the method includes the following steps:

(1) sequentially growing an epitaxial buffer layer, a GaN channel layer and an Al$_y$Ga$_{1-y}$N barrier layer on an epitaxial silicon substrate by using MOCVD to obtain an epitaxial wafer;

(2) using photoetching and ICP etching technology to prepare alignment marks required by multilayer photoetching steps on a surface of the epitaxial wafer to obtain etched mark points;

(3) according to the etched mark points, photoetching HEMT source electrode and drain electrode patterns in corresponding regions on the surface of the epitaxial wafer, depositing Ti/Al/Ni/Au metal electrodes by using a method of electron beam evaporation coating, and then performing rapid high-temperature annealing on the epitaxial wafer to form an ohmic contact electrode, wherein the annealing temperature is 830 to 850° C. and the annealing time is 30 to 60 s;

(4) photoetching the epitaxial wafer with the ohmic contact electrode prepared in the step (3), covering a device region with photoresist, and then performing mesa isolation on the GaN-HEMT device region by using the method of ICP etching;

(5) photoetching the gate electrode region of HEMT in the corresponding region of the surface of epitaxial wafer after mesa isolation, and depositing a Ni/Au metal electrode by using the method of electron beam evaporation coating to prepare a gate electrode, thereby forming a Schottky electrode to obtain a wafer of the gate electrode;

(6) by using the method of PECVD, growing one layer of silicon dioxide passivation film layer on the surface of the wafer with the gate electrode prepared, so as to obtain a passivation wafer;

(7) bonding the passivation wafer with a bonded silicon substrate together in a metal hot-press bonding mode, wherein specific steps are as follows: depositing a Ni/Au/Sn/Au multi-metal layer on a surface of the passivation wafer where the silicon dioxide passivation film layer is grown, depositing a Ti/Au/Sn/Au multi-metal layer on a surface of the bonded silicon substrate, and then adhering the two metal layers together, and putting them into a hot-press bonding machine for hot-press cementing to obtain a bonded wafer;

(8) putting the bonded wafer into a mechanical thinning machine, grinding and thinning the epitaxial silicon substrate, controlling the thinning thickness, and leaving the epitaxial silicon substrate with a thickness of 30 to 50 µm, and then soaking the bonded wafer in a nitric acid/hydrofluoric acid/acetic acid mixed acid solution with a volume ratio of 3:1:1 to 3:1:2 for 5 to 10 minutes to completely remove the epitaxial silicon substrate and expose AlN of the epitaxial buffer layer;

(9) etching the exposed AlN of the epitaxial buffer layer to a C-doped high-resistance GaN layer by using ICP to obtain a wafer with the epitaxial buffer layer etched;

(10) performing photoetching on the wafer with the epitaxial buffer layer etched, and exposing an opening etching region in the corresponding regions of the source electrode, the drain electrode and the gate electrode, performing electrode opening etching by using ICP technology, and then depositing a Ni/Au lead electrode by using the method of the electron beam evaporation coating, and depositing the Ni/Au metal layer at a position, opposite to gate electrode, on the upper surface of the epitaxial layer at the same time, so as to prepare a field plate electrode and form an inverted GaN-HEMT device with a sandwich structure.

Preferably, the epitaxial buffer layer in the step (1) includes 100 to 200 nm of AlN and 1 to 2 µm of C-doped high-resistance GaN layer; a thickness of the GaN channel layer is 100 to 300 nm; and a thickness of the $Al_yGa_{1-y}N$ barrier layer is 20 to 30 nm, and y=0.2 to 0.3.

Preferably, an etching depth of the etched mark points in the step (2) is greater than 600 nm.

Preferably, an etching depth of the mesa isolation in the step (4) is 100 to 200 nm.

Preferably, a thickness of the silicon dioxide passivation film layer in the step (6) is 1 to 2 µm.

Preferably, the bonding air pressure in the hot press bonding machine in the step (7) is 1E-3 to 2E-3 Pa, a bonding temperature is 280 to 300° C., a bonding pressure is 3 to 4 kBar, and a bonding time is 10 to 20 min.

Preferably, when etching the epitaxial buffer layer by ICP in the step (8), the C-doped high-resistance GaN layer remained is 0.5 to 1 µm.

Preferably, in the Ti/Al/Ni/Au metal electrodes in the step (3), a thickness of Ti metal layer is 10 to 20 nm, a thickness of the Al metal layer is 60 to 150 nm, a thickness of a Ni metal layer is 30 to 60 nm, and a thickness of the Au metal layer is 50 to 100 nm.

Preferably, a thickness of the Ni metal layer of the Ni/Au metal electrode in the step (5) is 30 to 100 nm, and a thickness of the Au metal layer is 50 to 100 nm.

The present invention has the following advantages and beneficial effects over the prior art:

In the GaN-HEMT device with sandwich structure prepared by the invention, the interface 2DEG of AlGaN/GaN heterojunction is controlled by the field effect of the lower gate electrode and the upper field plate, so that the breakdown voltage and gate voltage swing of the device are improved, and the linearity and pressure-resistant properties of the device are improved.

Figure 1:
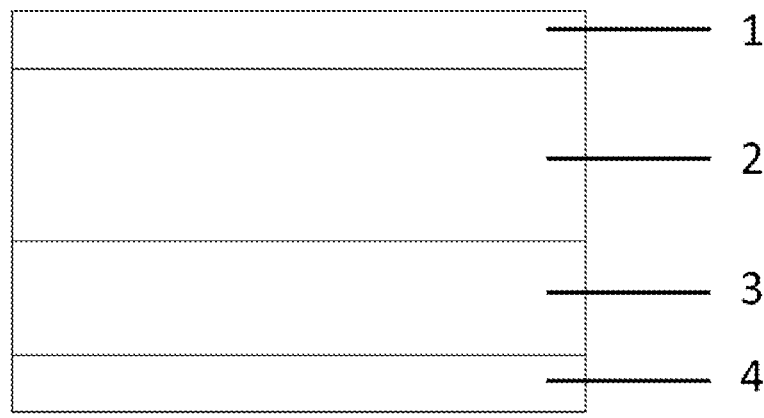
FIG. 1 is a schematic structural diagram of an epitaxial buffer layer, a GaN channel layer and an $Al_yGa_{0.75-y}N$ barrier layer sequentially grown on an epitaxial silicon substrate according to an embodiment of the present invention.

In the figures: 1—$Al_{0.25}Ga_{0.75}N$ barrier layer; 2—GaN channel layer; 3—epitaxial buffer layer; 4—epitaxial silicon substrate; 5—drain electrode; 6—gate electrode; 7—source electrode; 8—silicon dioxide passivation film layer; 9—bonded silicon substrate; 10—field plate electrode.

DESCRIPTION OF THE EMBODIMENTS

The present invention will be further described in detail with reference to examples and drawings, but the implementations of the present invention are not limited thereto.

Embodiment 1

This embodiment provides a GaN-HEMT device with a sandwich structure, the GaN-HEMT device includes an epitaxial layer and electrodes, wherein the epitaxial layer includes a GaN channel layer 2 of 150 nm and a $Al_{0.25}Ga_{0.75}N$ barrier layer 1 of 25 nm, and is arranged from top to bottom; the electrodes include a gate electrode 6, a source electrode 7, a drain electrode 5 and a field plate electrode 10, wherein the field plate electrode 10 and gate electrode 6 are respectively fabricated on an upper surface and a lower surface of the epitaxial layer and the field plate electrode 10 extends to a region beyond the epitaxial layer and is connected with the gate electrode 6 to form the sandwich structure, and the source electrode 7 and drain electrode 5 are respectively located at two ends of the epitaxial layer. Metal electrodes of Ti/Al/Ni/Au are deposited on a region corresponding to the source electrode 7 and the drain electrode 5, on the surface of $Al_{0.25}Ga_{0.75}N$ barrier layer 1 to prepare the source electrode 7 and the drain electrode 5, and ohmic contact is formed between the source electrode 7 and the drain electrode 5 and the epitaxial layer. In the Ti/Al/Ni/Au metal electrode, the thickness of Ti metal layer is 15 nm, the thickness of Al metal layer is 100 nm, the thickness of Ni metal layer is 45 nm and the thickness of Au metal layer is 60 nm.

In gate electrode region of the surface of $Al_{0.25}Ga_{0.75}N$ barrier layer, Ni/Au metal electrode is deposited to prepare the gate electrode 6, and schottky contact is formed between the gate electrode 6 and the epitaxial layer. The thickness of Ni metal layer of Ni/Au metal electrode is 60 nm, and the thickness of Au metal layer is 100 nm.

Ni(100 nm)/Au(100 nm) metal is deposited on the surface of the GaN channel layer 2 at the position opposite to the gate electrode 6 to prepare the field plate electrode 10. The field plate electrode 10 is connected to the gate electrode 6 to form a Schottky contact.

Figure 2:
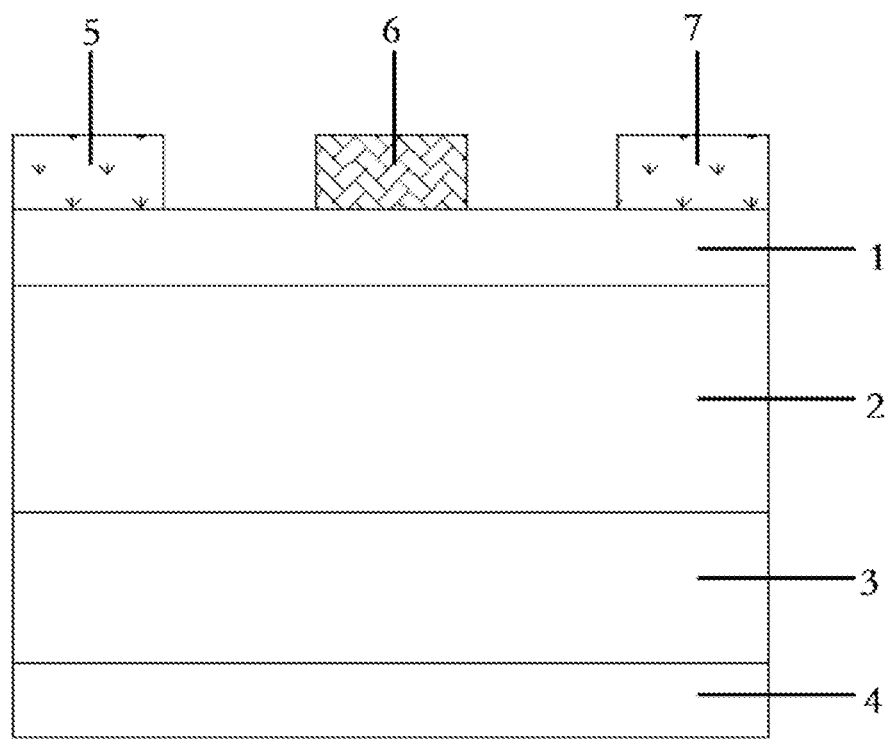
FIG. 2 is a schematic structural diagram of an epitaxial wafer according to an embodiment of the present invention after a gate electrode, a source electrode and a drain electrode are prepared.
Figure 3:
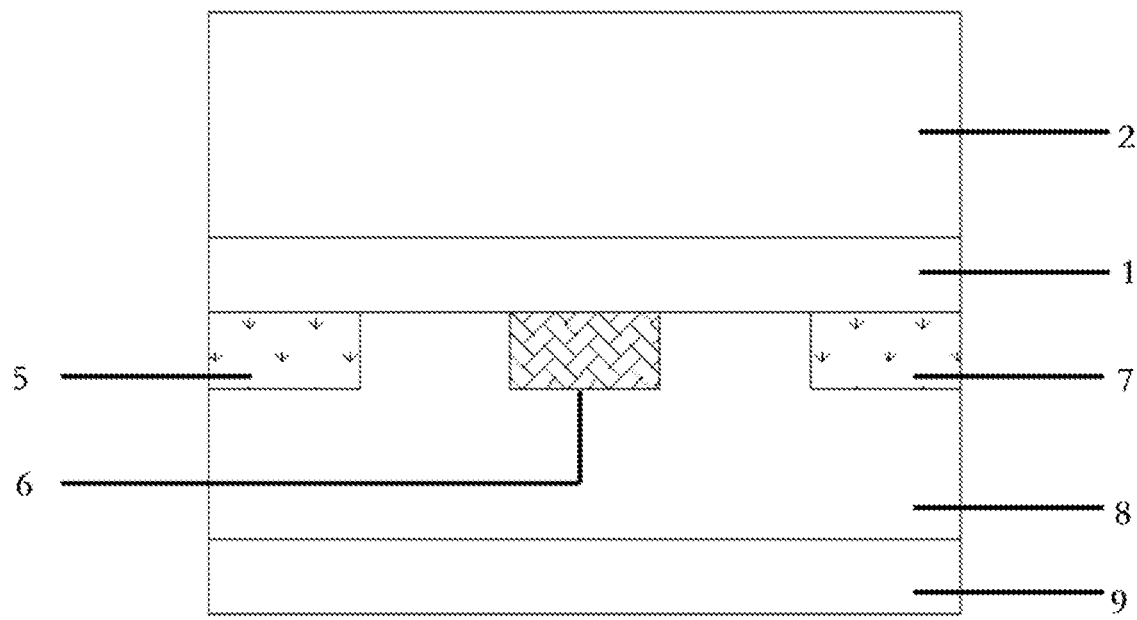
FIG. 3 is a schematic structural diagram of a wafer substrate etched with epitaxial buffer layer after transfer according to an embodiment of the present invention.
Figure 4:
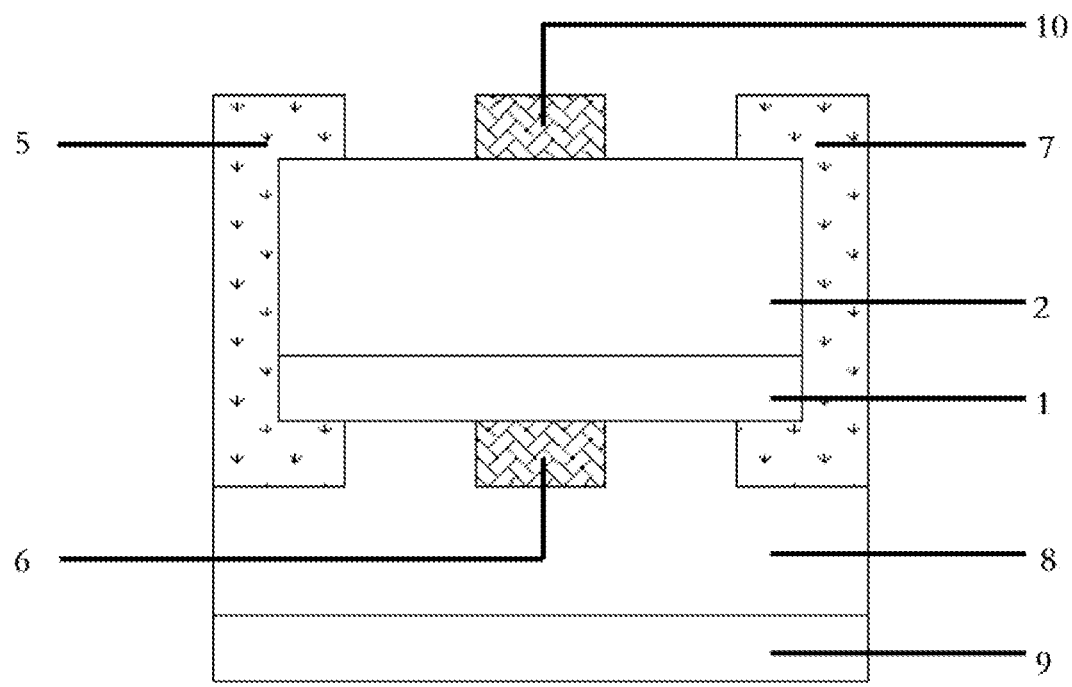
FIG. 4 is a schematic cross-sectional diagram of a lead electrode and a HEMT device with a sandwich structure prepared after through-hole etching according to an embodiment of the present invention.
Figure 5:
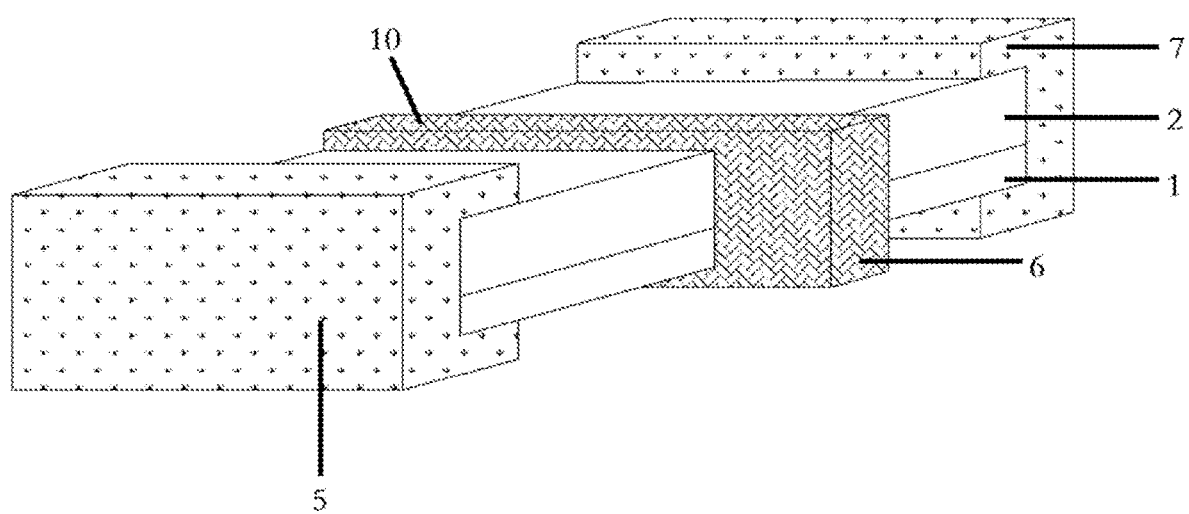
FIG. 5 is a partial three-dimensional schematic diagram of a HEMT device with a sandwich structure according to an embodiment of the present invention.

The following is the method for preparing the GaN-HEMT device with a sandwich structure provided by this embodiment, the method includes the following preparation steps:

(1) epitaxial buffer layer 3, GaN channel layer 2 and $Al_{0.25}Ga_{0.75}N$ barrier layer 1 are sequentially grown on epitaxial silicon substrate 4 by using MOCVD, the structure is shown in FIG. 1, which includes epitaxial buffer layer 3 composed of AlN of 150 nm and C-doped high resistance GaN layer of 1.5 μm, non-artificially doped GaN channel layer 2 of 150 nm, and $Al_{0.25}Ga_{0.75}N$ barrier layer 1 of 25 nm to obtain epitaxial wafer;

(2) using photoetching and ICP etching technology to prepare alignment marks required by multilayer photoetching steps on a surface of the epitaxial wafer, in order to make the mark points clearly visible after the substrate is transferred, the etching depth of the mark points is 700 nm;

(3) according to the etched mark points, photoetching HEMT source electrode and drain electrode patterns in corresponding regions of the surface of the epitaxial wafer, depositing Ti/Al/Ni/Au metal electrodes by using the method of electron beam evaporation coating, and then performing rapid high-temperature annealing on the epitaxial wafer to form an ohmic contact electrode. The annealing temperature is 840° C. and the annealing time is 30 s;

(4) photoetching the epitaxial wafer with the ohmic contact electrode prepared, covering a device region with photoresist, and then performing mesa isolation on the device region by using the method of ICP etching, and the etching depth of the mesa isolation is 150 nm;

(5) photoetching the gate electrode region of HEMT in the corresponding region of the surface of epitaxial wafer after mesa isolation, and depositing a Ni/Au metal electrode by using the method of the electron beam evaporation coating to prepare a gate electrode 6, thereby forming a Schottky electrode, at this time, the schematic cross-sectional diagram of the device is shown in FIG. 2;

(6) by using the method of PECVD, growing one layer of silicon dioxide passivation film layer 8 on the surface of the wafer with the gate electrode 6 prepared, wherein the thickness is 1.5 μm;

(7) bonding the passivated wafer with a bonded silicon substrate 9 together in a metal hot-press bonding mode, wherein the specific steps are as follows: depositing a Ni/Au/Sn/Au multi-metal layer on a surface of the passivation wafer, depositing a Ti/Au/Sn/Au multi-metal layer on a surface of the bonded silicon substrate 9, and then adhering the two metal layers together, and putting them into a hot-press bonding machine for hot-press cementing, the bonding air pressure is 2E-3 Pa, the bonding temperature is 300° C., the bonding pressure is 3.5 kBar, and the bonding time is 15 min;

(8) putting the bonded wafer into a mechanical thinning machine, grinding and thinning the epitaxial silicon substrate 4, controlling the thinning thickness, and leaving the epitaxial silicon substrate 4 with a thickness of 40 μm, and then soaking the bonded wafer in a nitric acid/hydrofluoric acid/acetic acid mixed acid solution with a volume ratio of 3:1:1 for 8 minutes (nitric acid, hydrofluoric acid and acetic acid are commercially available) to completely remove the epitaxial silicon substrate 4 and expose AlN of the epitaxial buffer layer;

(9) etching the exposed AlN of the epitaxial buffer layer to a C-doped high-resistance GaN layer by using ICP and remaining the C-doped high-resistance GaN layer of 0.7 μm to obtain a wafer with the epitaxial buffer layer etched, as shown in FIG. 3;

(10) performing photoetching on the wafer with the epitaxial buffer layer etched, and exposing an opening etching region in the corresponding regions of the source electrode 7, the drain electrode 5 and the gate electrode 6, performing electrode opening etching by using ICP technology, and then depositing a Ni/Au lead electrode by using the method of the electron beam evaporation coating, and depositing the Ni/Au metal layer at a position, opposite to gate electrode, on the upper surface of the epitaxial layer at the same time, so as to prepare a field plate electrode 10 and form a GaN-HEMT device with a sandwich structure. A cross-sectional view of the final device is shown in FIG. 4, and a three-dimensional schematic diagram of the sandwich structure is shown in FIG. 5.

The GaN-HEMT power device with sandwich structure prepared in this embodiment passed the three-terminal test of semiconductor analyzer, and compared with the planar structure device with the same size, the breakdown voltage increased from 530V to 650V, and the gate voltage swing increased from 3V to 6V.

Embodiment 2

This embodiment provides a GaN-HEMT device with a sandwich structure, the GaN-HEMT device includes an epitaxial layer and electrodes, wherein the epitaxial layer includes a GaN channel layer 2 of 150 nm and a $Al_{0.25}Ga_{0.75}N$ barrier layer 1 of 25 nm, and is arranged from top to bottom; the electrodes include a gate electrode 6, a source electrode 7, a drain electrode 5 and a field plate electrode 10, wherein the field plate electrode 10 and gate electrode 6 are respectively fabricated on an upper surface and a lower surface of the epitaxial layer and the field plate electrode 10 extends to a region beyond the epitaxial layer and is connected with the gate electrode 6 to form the sandwich structure, and the source electrode 7 and drain electrode 5 are respectively located at two ends of the epitaxial layer. Metal electrodes of Ti/Al/Ni/Au are deposited on a region corresponding to the source electrode 7 and the drain electrode 5, on the surface of $Al_{0.25}Ga_{0.75}N$ barrier layer 1 to prepare the source electrode 7 and the drain electrode 5, and ohmic contact is formed between the source electrode 7 and the drain electrode 5 and the epitaxial layer. In the Ti/Al/Ni/Au metal electrode, the thickness of Ti metal layer is 15 nm, the thickness of Al metal layer is 100 nm, the thickness of Ni metal layer is 45 nm and the thickness of Au metal layer is 60 nm.

In gate electrode region of the surface of $Al_{0.25}Ga_{0.75}N$ barrier layer 1, Ni/Au metal electrode is deposited to prepare gate electrode 6, and schottky contact is formed between the gate electrode 6 and the epitaxial layer. The thickness of Ni metal layer of Ni/Au metal electrode is 60 nm, and the thickness of Au metal layer is 100 nm.

Ni(100 nm)/Au(100 nm) metal layer is deposited on the surface of the GaN channel layer 2 at the position opposite to the gate electrode 6 to prepare the field plate electrode 10. The field plate electrode 10 is connected to the gate electrode 6 to form a Schottky contact.

The following is the method for preparing the GaN-HEMT device with a sandwich structure provided by this embodiment, the method includes the following preparation steps:

(1) epitaxial buffer layer 3, GaN channel layer 2 and $Al_{0.25}Ga_{0.75}N$ barrier layer 1 are sequentially grown on epitaxial silicon substrate 4 by using MOCVD, the structure is shown in FIG. 1, which includes epitaxial buffer layer 3 composed of AlN of 150 nm and C-doped high resistance GaN layer of 1.5 μm, non-artificially doped GaN channel layer 2 of 150 nm, and $Al_{0.25}Ga_{0.75}N$ barrier layer 1 of 25 nm to obtain epitaxial wafer;

(2) using photoetching and ICP etching technology to prepare alignment marks required by multilayer photoetching steps on a surface of the epitaxial wafer, in order to make the mark points clearly visible after the substrate is transferred, the etching depth of the mark points is 700 nm;

(3) according to the etched mark points, photoetching HEMT source electrode and drain electrode patterns in corresponding regions of the surface of the epitaxial wafer, depositing Ti/Al/Ni/Au metal electrodes by using the method of electron beam evaporation coating, and then performing rapid high-temperature annealing on the epitaxial wafer to prepare a source electrode 7 and a drain electrode 5 to form an ohmic contact electrode. The annealing temperature is 840° C. and the annealing time is 30 s;

(4) photoetching the epitaxial wafer with the ohmic contact electrode prepared, covering a device region with photoresist, and then performing mesa isolation on the device region by using the method of ICP etching, and the etching depth of the mesa isolation is 150 nm;

(5) photoetching the gate electrode region of HEMT in the corresponding region of the surface of epitaxial wafer after mesa isolation, and depositing a Ni/Au metal electrode by using the method of the electron beam evaporation coating to prepare a gate electrode 6, thereby forming a Schottky electrode, at this time, the schematic cross-sectional diagram of the device is shown in FIG. 2;

(6) by using the method of PECVD, growing one layer of silicon dioxide passivation film layer 8 on the surface of the wafer with the gate electrode prepared, wherein the thickness is 1 μm;

(7) bonding the passivated wafer with a bonded silicon substrate 9 together in a metal hot-press bonding mode, wherein the specific steps are as follows: depositing a Ni/Au/Sn/Au multi-metal layer on a surface of the passivation wafer, depositing a Ti/Au/Sn/Au multi-metal layer on a surface of the bonded silicon substrate 9, and then adhering the two metal layers together, and putting them into a hot-press bonding machine for hot-press cementing, the bonding pressure is 2E-3 Pa, the bonding temperature is 300° C., the bonding pressure is 3.5 kBar, and the bonding time is 15 min;

(8) putting the bonded wafer into a mechanical thinning machine, grinding and thinning the epitaxial silicon substrate, controlling the thinning thickness, and leaving the epitaxial silicon substrate with a thickness of 40 μm, and then soaking the bonded wafer in a nitric acid/hydrofluoric acid/acetic acid mixed acid solution with a volume ratio of 3:1:1 for 8 minutes (nitric acid, hydrofluoric acid and acetic acid are commercially available) to completely remove the epitaxial silicon substrate 4 and expose AlN of the epitaxial buffer layer 3;

(9) etching the exposed AlN of the epitaxial buffer layer 3 to a C-doped high-resistance GaN layer by using ICP and remaining the C-doped high-resistance GaN layer 0.7 of μm to obtain a wafer with the epitaxial buffer layer 3 etched, as shown in FIG. 3;

(10) performing photoetching on the wafer with the epitaxial buffer layer etched, and exposing an opening etching region in the corresponding regions of the source electrode 7, the drain electrode 5 and the gate electrode 6, performing electrode opening etching by using ICP technology, and then depositing a Ni/Au lead electrode by using the method of the electron beam evaporation coating, and depositing the Ni/Au metal layer at a position, opposite to gate electrode 6 on the upper surface of the epitaxial layer at the same time, so as to prepare a field plate electrode 10 and form a GaN-HEMT device with a sandwich structure. A cross-sectional view of the final device is shown in FIG. 4, and a three-dimensional schematic diagram of the sandwich structure is shown in FIG. 5.

The GaN-HEMT power device with sandwich structure prepared in this embodiment passed the three-terminal test of semiconductor analyzer, and compared with the planar structure device with the same size, the breakdown voltage increased from 530V to 589V, and the gate voltage swing increased from 3V to 5.8V.

Embodiment 3

This embodiment provides a GaN-HEMT device with a sandwich structure, the GaN-HEMT device includes an epitaxial layer and electrodes, wherein the epitaxial layer includes a GaN channel layer 2 of 150 nm and a $Al_{0.25}Ga_{0.75}N$ barrier layer 1 of 25 nm, and is arranged from top to bottom; the electrodes include a gate electrode 6, a source electrode 7, a drain electrode 5 and a field plate electrode 10, wherein the field plate electrode 10 and gate electrode 6 are respectively fabricated on an upper surface and a lower surface of the epitaxial layer and the field plate electrode 10 extends to a region beyond the epitaxial layer and is connected with the gate electrode 6 to form the sandwich structure, and the source electrode 7 and drain electrode 5 are respectively located at two ends of the epitaxial layer. Metal electrodes of Ti/Al/Ni/Au are deposited on a region corresponding to the source electrode 7 and the drain electrode 5, on the surface of $Al_{0.25}Ga_{0.75}N$ barrier layer 1 to prepare the source electrode 7 and the drain electrode 5, and ohmic contact is formed between the source electrode 7 and the drain electrode 5 and the epitaxial layer. In the Ti/Al/Ni/Au metal electrode, the thickness of Ti metal layer is 15 nm, the thickness of Al metal layer is 100 nm, the thickness of Ni metal layer is 45 nm and the thickness of Au metal layer is 60 nm.

In gate electrode region of the surface of $Al_{0.25}Ga_{0.75}N$ barrier layer 1, Ni/Au metal electrode is deposited to prepare gate electrode 6, and schottky contact is formed between the gate electrode 6 and epitaxial layer. The thickness of Ni metal layer of Ni/Au metal electrode is 60 nm, and the thickness of Au metal layer is 100 nm.

Ni(100 nm)/Au(100 nm) metal layer is deposited on the surface of the GaN channel layer 2 at the position opposite to the gate electrode 6 to prepare the field plate electrode 10. The field plate electrode 10 is connected to the gate electrode 6 to form a Schottky contact.

The following is the method for preparing the GaN-HEMT device with a sandwich structure provided by this embodiment, the method includes the following preparation steps:

(1) epitaxial buffer layer 3, GaN channel layer 2 and $Al_{0.25}Ga_{0.75}N$ barrier layer 1 sequentially are grown on epitaxial silicon substrate 4 by using MOCVD, the structure is shown in FIG. 1, which includes epitaxial buffer layer 3 composed of AlN of 150 nm and C-doped high resistance GaN layer of 1.5 μm, non-artificially doped GaN channel layer 2 of 150 nm, and $Al_{0.25}Ga_{0.75}N$ barrier layer 1 of 25 nm to obtain epitaxial wafer;

(2) using photoetching and ICP etching technology to prepare alignment marks required by multilayer photoetching steps on a surface of the epitaxial wafer, in order to make the mark points clearly visible after the substrate is transferred, the etching depth of the mark points is 700 nm;

(3) according to the etched mark points, photoetching HEMT source electrode and drain electrode patterns in corresponding regions of the surface of the epitaxial wafer, depositing Ti/Al/Ni/Au metal electrodes by using the method of electron beam evaporation coating, and then performing rapid high-temperature annealing on the epitaxial wafer to prepare a source electrode 7 and a drain electrode 5 to form an ohmic contact electrode. The annealing temperature is 840° C. and the annealing time is 30 s;

(4) photoetching the epitaxial wafer with the ohmic contact electrode prepared, covering a device region with photoresist, and then performing mesa isolation on the device region by using the method of ICP etching, and the etching depth of the mesa isolation is 150 nm;

(5) photoetching the gate electrode region of HEMT in the corresponding region of the surface of epitaxial wafer after mesa isolation, and depositing a Ni/Au metal electrode by using the method of the electron beam evaporation coating to prepare a gate electrode 6, thereby forming a Schottky electrode, at this time, the schematic cross-sectional diagram of the device is shown in FIG. 2;

(6) by using the method of PECVD, growing one layer of silicon dioxide passivation film layer 8 on the surface of the wafer with the gate electrode prepared, wherein the thickness is 2 μm;

(7) bonding the passivated wafer with a bonded silicon substrate 9 together in a metal hot-press bonding mode, wherein the specific steps are as follows: depositing a Ni/Au/Sn/Au multi-metal layer on a surface of the passivation wafer, depositing a Ti/Au/Sn/Au multi-metal layer on a surface of the bonded silicon substrate 9, and then adhering the two metal layers together, and putting them into a hot-press bonding machine for hot-press cementing, the bonding air pressure is 2E-3 Pa, the bonding temperature is 300° C., the bonding pressure is 3.5 kBar, and the bonding time is 15 min;

(8) putting the bonded wafer into a mechanical thinning machine, grinding and thinning the epitaxial silicon substrate 4, controlling the thinning thickness, and leaving the epitaxial silicon substrate 4 with a thickness of 40 μm, and then soaking the bonded wafer in a nitric acid/hydrofluoric acid/acetic acid mixed acid solution with a volume ratio of 3:1:1 for 8 minutes (nitric acid, hydrofluoric acid and acetic acid are commercially available) to completely remove the epitaxial silicon substrate 4 and expose AlN of the epitaxial buffer layer;

(9) etching the exposed AlN of the epitaxial buffer layer 3 to a C-doped high-resistance GaN layer by using ICP and remaining the C-doped high-resistance GaN layer of 0.7 μm to obtain a wafer with the epitaxial buffer layer 3 etched, as shown in FIG. 3;

(10) performing photoetching on the wafer with the epitaxial buffer layer 3 etched, and exposing an opening etching region in the corresponding regions of the source electrode 7, the drain electrode 5 and the gate electrode 6, performing electrode opening etching by using ICP technology, and then depositing a Ni/Au lead electrode by using the method of the electron beam evaporation coating, and depositing the Ni/Au metal layer at a position, opposite to gate electrode 6 on the upper surface of the epitaxial layer at the same time, so as to prepare a field plate electrode 10 and form a GaN-HEMT device with a sandwich structure. A cross-sectional view of the final device is shown in FIG. 4, and a three-dimensional schematic diagram of the sandwich structure is shown in FIG. 5.

The GaN-HEMT power device with sandwich structure prepared in this embodiment passed the three-terminal test of semiconductor analyzer, and compared with the planar structure device with the same size, the breakdown voltage increased from 530V to 670V, and the gate voltage swing increased from 3V to 5.7V.

According to the present invention, the substrate transfer technology is used to achieve the inversion of the device structure, thereby achieving the sandwich structure of the device, ensuring the integrity of the conductive channel, improving the control effect of the gate electrode on the two-dimensional electron gas, and improving the breakdown voltage and the gate voltage swing.

The above embodiments are preferred implementations of the present invention, but the implementations of the present invention are not limited by the embodiments, any other changes, modifications, substitutions, combinations and simplifications made without departing from the spirit and principles of the present invention shall be equivalent substitutions and shall be included in the scope of protection of the present invention.

What is claimed is:

1. A method for preparing a GaN-HEMT device with a sandwich structure, wherein the GaN-HEMT device comprises an epitaxial layer and electrodes, wherein the epitaxial layer comprises a GaN channel layer and an $Al_yGa_{1-y}N$ barrier layer, and y is 0.2 to 0.3; the GaN channel layer and the $Al_yGa_{1-y}N$ barrier layer are arranged from top to bottom; the electrodes comprise a gate electrode, a source electrode, a drain electrode and a field plate electrode, wherein the field plate electrode and the gate electrode are respectively fabricated on an upper surface and a lower surface of the epitaxial layer, and the field plate electrode extends to a region beyond the epitaxial layer and is connected with the gate electrode to form the sandwich structure, and the source electrode and the drain electrode are respectively located at two ends of the epitaxial layer, wherein the method comprises following steps:
(1) sequentially growing an epitaxial buffer layer, a GaN channel layer and an $Al_yGa_{1-y}N$ barrier layer on an epitaxial silicon substrate by using MOCVD to obtain an epitaxial wafer;
(2) using photoetching and ICP etching technology to prepare alignment marks required by multilayer photoetching steps on a surface of the epitaxial wafer to obtain etched mark points;
(3) according to the etched mark points, photoetching HEMT source electrode and drain electrode patterns in corresponding regions on the surface of the epitaxial wafer, depositing Ti/Al/Ni/Au metal electrodes by using a method of electron beam evaporation coating, and then performing rapid high-temperature annealing on the epitaxial wafer to prepare a source electrode and a drain electrode to form an ohmic contact electrode, wherein an annealing temperature is 830 to 850° C. and an annealing time is 30 to 60 s;

(4) photoetching the epitaxial wafer with the ohmic contact electrode prepared in the step (3), covering a device region with photoresist, and then performing mesa isolation on the GaN-HEMT device region by using the method of ICP etching;

(5) photoetching a gate electrode region of HEMT in corresponding region of the surface of epitaxial wafer after mesa isolation, and depositing a Ni/Au metal electrode by using the method of electron beam evaporation coating to prepare a gate electrode, thereby forming a Schottky electrode to obtain a wafer of the gate electrode;

(6) by using a method of PECVD, growing one layer of silicon dioxide passivation film layer on the surface of the wafer with the gate electrode prepared, so as to obtain a passivation wafer;

(7) bonding the passivation wafer with a bonded silicon substrate together in a metal hot-press bonding mode, wherein specific steps are as follows: depositing a Ni/Au/Sn/Au multi-metal layer on a surface of the passivation wafer where the silicon dioxide passivation film layer is grown, depositing a Ti/Au/Sn/Au multi-metal layer on a surface of the bonded silicon substrate, and then adhering the two metal layers together, and putting them into a hot-press bonding machine for hot-press cementing to obtain a bonded wafer;

(8) putting the bonded wafer into a mechanical thinning machine, grinding and thinning the epitaxial silicon substrate, controlling a thinning thickness, and leaving the epitaxial silicon substrate with a thickness of 30 to 50 μm, and then soaking the bonded wafer in a nitric acid/hydrofluoric acid/acetic acid mixed acid solution with a volume ratio of 3: 1: 1 to 3: 1: 2 for 5 to 10 minutes to completely remove the epitaxial silicon substrate and expose AlN of the epitaxial buffer layer; etching the exposed AlN of the epitaxial buffer layer to a C-doped high-resistance GaN layer by using ICP to obtain a wafer with the epitaxial buffer layer etched;

(9) performing photoetching on the wafer with the epitaxial buffer layer etched, and exposing an opening etching region in the corresponding regions of the source electrode, the drain electrode and the gate electrode, performing electrode opening etching by using ICP technology, and then depositing a Ni/Au lead electrode by using the method of the electron beam evaporation coating, and depositing the Ni/Au metal layer at a position, opposite to gate electrode, on an upper surface of the epitaxial layer at the same time, so as to prepare a field plate electrode and form an inverted GaN-HEMT device with a sandwich structure.

2. The method for preparing the GaN-HEMT device with the sandwich structure according to claim 1, wherein the epitaxial buffer layer in the step (1) comprises 100 to 200 nm of AlN and 1 to 2 μm of C-doped high-resistance GaN layer; a thickness of the GaN channel layer is 100 to 300 nm; and a thickness of the $Al_yGa_{1-y}$ barrier layer is 20 to 30 nm.

3. The method for preparing the GaN-HEMT device with the sandwich structure according to claim 1, wherein an etching depth of the etched mark points in the step (2) is greater than 600 nm.

4. The method for preparing the GaN-HEMT device with the sandwich structure according to claim 1, wherein an etching depth of the mesa isolation in the step (4) is 100 to 200 nm.

5. The method for preparing the GaN-HEMT device with the sandwich structure according to claim 1, wherein a thickness of the silicon dioxide passivation film layer in the step (6) is 1 to 2 μm.

6. The method for preparing the GaN-HEMT device with the sandwich structure according to claim 1, wherein a bonding air pressure in the hot-press bonding machine in the step (7) is 1E-3 to 2E-3 Pa, a bonding temperature is 280 to 300° C., a bonding pressure is 3 to 4 kBar, and a bonding time is 10 to 20 min.

7. The method for preparing the GaN-HEMT device with the sandwich structure according to claim 1, wherein when etching the epitaxial buffer layer by ICP in the step (8), the C-doped high-resistance GaN layer remained is 0.5 to 1 μm.

8. The method for preparing the GaN-HEMT device with the sandwich structure according to claim 1, wherein in the Ti/Al/Ni/Au metal electrodes in the step (3), a thickness of the Ti metal layer is 10 to 20 nm, a thickness of the Al metal layer is 60 to 150 nm, a thickness of the Ni metal layer is 30 to 60 nm, and a thickness of the Au metal layer is 50 to 100 nm.

9. The method for preparing the GaN-HEMT device with the sandwich structure according to claim 1, wherein a thickness of the Ni metal layer of the Ni/Au metal electrode in the step (5) is 30 to 100 nm, and a thickness of the Au metal layer is 50 to 100 nm.

* * * * *